United States Patent
Farrow et al.

(10) Patent No.: US 7,581,203 B2
(45) Date of Patent: Aug. 25, 2009

(54) METHOD AND APPARATUS FOR MANUFACTURING MULTIPLE CIRCUIT PATTERNS USING A MULTIPLE PROJECT MASK

(75) Inventors: Reginald C. Farrow, Somerset, NJ (US); Warren K. Waskiewicz, Clinton, NJ (US)

(73) Assignee: Agere Systems Inc., Allentown, PA (US)

( * ) Notice: Subject to any disclaimer, the term of this patent is extended or adjusted under 35 U.S.C. 154(b) by 1189 days.

(21) Appl. No.: 10/610,002

(22) Filed: Jun. 30, 2003

(65) Prior Publication Data
US 2004/0268272 A1 Dec. 30, 2004

(51) Int. Cl.
*G06F 17/50* (2006.01)
*G06K 9/00* (2006.01)

(52) U.S. Cl. .......... 716/21; 382/145
(58) Field of Classification Search .......... 716/5, 716/19–21; 382/144–145; 430/5; 438/30; 700/121
See application file for complete search history.

(56) References Cited

U.S. PATENT DOCUMENTS

| 5,866,281 A * | 2/1999 | Guckel et al. .......... 430/22 |
| 6,211,050 B1 * | 4/2001 | Wong .......... 438/597 |
| 6,852,471 B2 * | 2/2005 | Pierrat et al. .......... 430/311 |
| 2003/0165749 A1 * | 9/2003 | Fritze et al. .......... 430/5 |
| 2003/0229875 A1 * | 12/2003 | Smith et al. .......... 716/10 |
| 2004/0010768 A1 * | 1/2004 | Toublan et al. .......... 716/21 |

FOREIGN PATENT DOCUMENTS

EP    1045288 A2 * 10/2000

* cited by examiner

*Primary Examiner*—Stacy A Whitmore
(74) *Attorney, Agent, or Firm*—Ryan, Mason & Lewis, LLP

(57) ABSTRACT

A method and apparatus are disclosed for fabricating a substrate having a plurality of circuit patterns. The substrate is exposed to a primary mask having a plurality of the desired circuit patterns, surrounded by one or more exclusion regions, and a secondary mask having a pattern corresponding to the exclusion regions that satisfies at least one design rule for a subsequent process. The primary and secondary masks are exposed on the substrate in any order before the resist patterns are developed. The pattern on the secondary mask may comprise, for example, an array of fill patterns. The pattern on the secondary mask may satisfy design rules for more than one process level so that a single secondary mask can be utilized for multiple process levels. In addition, the substrate only needs to be exposed to the secondary mask for process levels where the exclusion regions violate a design rule.

18 Claims, 1 Drawing Sheet

METHOD AND APPARATUS FOR MANUFACTURING MULTIPLE CIRCUIT PATTERNS USING A MULTIPLE PROJECT MASK

FIELD OF THE INVENTION

The present invention relates generally to the process of manufacturing integrated circuit (IC) devices, and more particularly, to the process of manufacturing multiple circuit patterns from the same photographic mask.

BACKGROUND OF THE INVENTION

Integrated circuits are typically manufactured using photolithography techniques to produce a desired pattern from a photolithographic mask, often referred to as a "photomask," on a substrate material or wafer. The photomask may be of the type where the circuit pattern is magnified, for example, four or five times. The lithography stepper projects an image of the photomask that is demagnified to the desired size onto a resist coated wafer. In order to amortize the increasing costs of photomasks over multiple circuit patterns or over multiple production stages of the same circuit pattern, it has been proposed to employ photomasks that produce multiple circuit patterns on the same substrate. Similarly, photomasks have been proposed to produce a primary circuit pattern and related supplemental circuitry, such as test and process verification circuitry. A photomask that produces multiple circuits is often referred to as a multi-project (MP) reticle or mask.

It would be expected that during a circuit design verification phase of the product development cycle, all of the various circuit patterns, including any supplemental test circuits be printed from the multi-project mask. That is, the entire photomask field is printed at once. Ultimately, however, one or more of the various circuit patterns may be printed separately by reducing the exposure illumination area (i.e., the field of view) of the lithography stepper to only the portion of the mask that corresponds to the desired circuit pattern. Such a reduction in the illumination area is typically accomplished through the use of framing blades inserted physically up stream of the photomask. In order to accommodate the uncertainty of the framing blade positions that define the limited exposure illumination area, the areas for each circuit pattern on a multi-project mask are surrounded by an opaque region, often referred to as an "exclusion region." This exclusion region is an area of solid chrome on the photomask and is independent of the tone of the resist to be exposed. The exclusion regions surrounding each pattern area typically have lateral dimensions in the range of 50-300 micrometers on the scale of the wafer (demagnified from the mask scale).

Following the resist exposure of a single pattern area, the exclusion region will typically cause the latent image of the printed circuit pattern to be surrounded by an unexposed region of resist. In a step-and-repeat exposure sequence, subsequent printed patterns are aligned adjacent to the previous ones precisely and the unexposed band adjacent to the previously printed circuit patterns are exposed. Therefore, by "butting" the patterns together on the wafer, the exclusion region around each pattern is overprinted, thereby avoiding a featureless region around each pattern area on the wafer.

For an MP mask, the butting process only avoids printing featureless areas around a pattern area if a single pattern area is printed from the mask. When multiple pattern areas are printed from an MP mask, the exclusion regions will not only be around the printed pattern area but will also lie within the pattern area (separating individual patterns). The exclusion regions that separate the patterns on the mask will leave featureless regions in the resist that will remain after the step-and-repeat printing process. For a positive resist process, the exclusion region will leave band(s) of resist within each repeated area that separate the multiple patterns after resist development. For a negative resist process, the exclusion region will leave band(s) where the resist has been removed after resist development.

Generally, there are design rules that limit, among other things, the pattern density of regions and feature sizes on the wafer to comply with etch and chemical mechanical polish process (CMP) specifications that follow the photolithographic exposure steps. It has been found that when printed, the exclusion regions on multiple project masks may have a harmful affect on some etch processes, including etch and chemical mechanical polishing process. When the various circuit patterns (including any supplemental test circuits) are printed from the multi-project mask during, e.g., the circuit design verification phase, the exclusion regions violate critical design rules. Thus, the multi-project masks may cause design rule violations when multiple patterns are printed from the mask and make it difficult to verify critical process steps, thereby defeating the initial motivation to use the multi-project masks.

It is advantageous if a method for manufacturing multiple circuit patterns (or a primary circuit pattern and related supplemental circuitry) used the same multi-project mask to print multiple circuit patterns during a circuit design phase or process verification phase and to selectively print individual circuit patterns during a production phase. A need therefore exists for a method for manufacturing multiple circuit patterns (or a primary circuit pattern and related supplemental circuitry) that overcomes the above problems and limitations of the prior art.

SUMMARY OF THE INVENTION

Generally, a method and apparatus are disclosed for fabricating a substrate, such as a semiconductor wafer or a glass substrate such as those used for liquid crystal displays, having a plurality of circuit patterns. The method takes advantage of double exposure of the resist prior to resist development. According to one aspect of the present invention, the substrate is exposed to a primary mask having a plurality of desired circuit patterns, surrounded by one or more exclusion regions, and a secondary mask having a pattern corresponding to the one or more exclusion regions that satisfies at least one design rule for a subsequent process. The primary and secondary masks are exposed on the substrate in any order before the resulting resist patterns are developed. The pattern on the secondary mask may comprise, for example, an array of fill patterns.

According to another aspect of the invention, the pattern on the secondary mask may satisfy design rules for more than one process level, so that a single secondary mask can be utilized for multiple process levels. In addition, the substrate only needs to be exposed to the secondary mask for process levels where the exclusion regions violate a design rule.

A more complete understanding of the present invention, as well as further features and advantages of the present invention, will be obtained by reference to the following detailed description and drawings.

DETAILED DESCRIPTION

Figure 1:
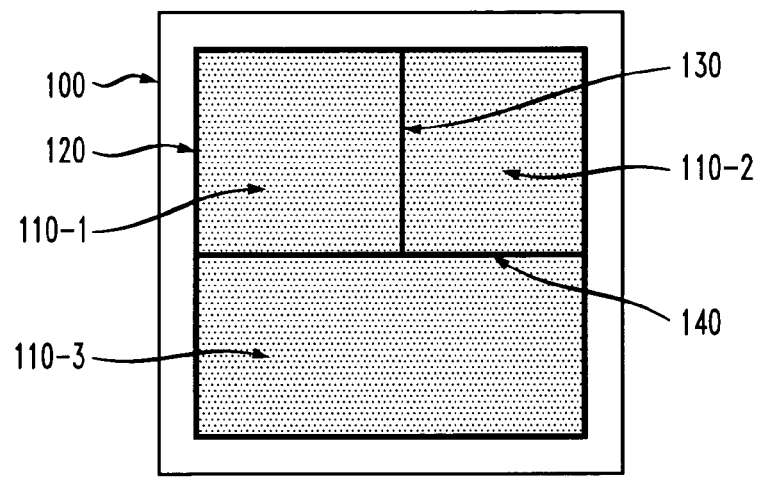
FIG. 1 illustrates a conventional multiple project mask for producing multiple circuit patterns on the same substrate.

FIG. 1 illustrates a conventional multiple project mask 100 for producing multiple circuit patterns on the same substrate. As shown in FIG. 1, the exemplary multiple project mask 100 includes three pattern areas 110-1 through 110-3 that can be selectively printed on a substrate, in a known manner. Typically, there is a multiple project mask 100 for each process level on the wafer. As shown in FIG. 1, the combined pattern area, i.e., areas 110-1 through 110-3, is surrounded by an opaque region 120 that defines the full exposure area of the mask 100 when the combined area is printed on a wafer, e.g., when areas 110-1 through 110-3 are printed simultaneously. To facilitate selective printing of each pattern area 110-1 through 110-3, each pattern area 110-1 through 110-3 must also be surrounded by an opaque exclusion region 130, 140. The opaque exclusion regions 130, 140 separate or isolate the pattern areas 110-1 through 110-3 from one another and help define the exposure area when a reduced flash field is used to selectively print the individual patterns 110-1 through 110-3. Generally, the widths of the vertical exclusion band 130 and the horizontal exclusion band 140 are specified by the lithography exposure tool (stepper or scanner) and depends on its optical configuration.

As previously indicated, when the entire mask 100 is printed with all of the pattern areas 110-1 through 110-3, the opaque exclusion areas 130 and 140 between each individual pattern 110-1 through 110-3 may violate design rules for some process levels. For example, for the chemical mechanical process, the etch rate can depend strongly on the feature size. Large features may etch slower than small features. Therefore, design limits are set on the largest feature size and pattern density to keep the etch rate uniform across the substrate. Since the exclusion areas 130 and 140 typically violate design rules, the multi-project mask 100 is only useful when single pattern areas 110-1 through 110-3 are printed on the substrate using a reduced flash field, thereby defeating the initial motivation to use the multi-project masks. Only when single pattern areas 110-1 through 110-3 are printed will the butting process during step-and-repeat eliminate the bands of featureless area around the pattern areas 110-1 through 110-3.

Figure 2:
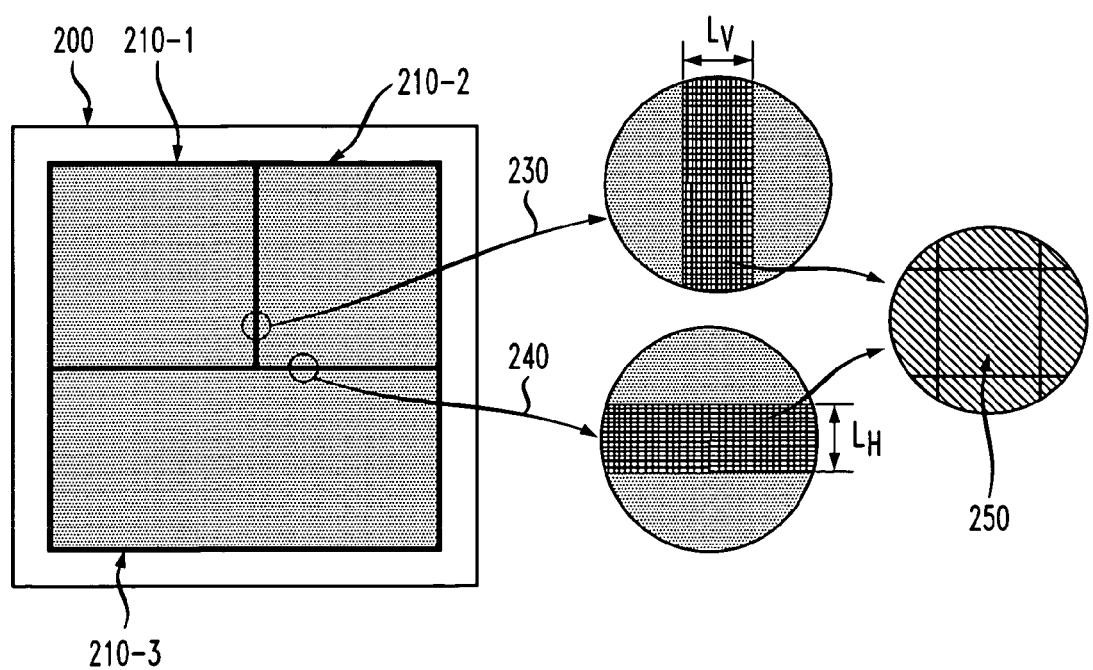
FIG. 2 illustrates a secondary multiple project mask for producing multiple circuit patterns on the same substrate in accordance with the present invention.

FIG. 2 illustrates a secondary multiple project mask 200 for producing multiple circuit patterns on the same substrate in accordance with the present invention. According to one aspect of the present invention, the secondary multiple project mask 200 is used in conjunction with the multiple project mask 100 of FIG. 1 for levels where design rules would be violated by the exclusion areas 130 and 140. As shown in FIG. 2, the secondary mask 200 includes pattern areas 210-1 through 210-3 corresponding to the pattern areas 110-1 through 110-3 of the multiple project mask 100 of FIG. 1. The pattern areas 210-1 through 210-3 are opaque so that the primary pattern areas 110-1 through 110-3 are not double exposed.

According to another aspect of the invention, the secondary mask 200 also includes exclusion areas 230, 240 having a pattern 250 that satisfies one or more design rules for the process level. The pattern 250 can be constructed, for example, as an array of fill patterns that satisfy the design rule specifications. The secondary multiple project mask 200 is only required when two or more of the pattern areas 110-1 through 110-3 are printed from the multiple project mask 100 and only on process levels where the exclusion areas 130 and 140 violate one or more design rules.

According to a further aspect of the invention, the secondary multiple project mask 200 should be fabricated, if possible, such that a single secondary multiple project mask 200 can be used for multiple process levels, when needed. Generally, a single secondary multiple project mask 200 will be suitable for more than one process level if the fill pattern 250 in the exclusion areas 230, 240 can be patterned to satisfy design rule specifications for more than one process level. The minimum number of secondary multiple project masks 200 will then be fabricated and the cost will be minimized.

It is expected that the secondary multiple project mask 200 can be fabricated with significantly less expense than the multiple project mask 100 because the actual patterned area that is written on the secondary mask 200 is much smaller than that of the multiple project mask 100 and the fill pattern feature 250 will not have critical (small) size features. The write times and defect requirements of the secondary multiple project mask 200 should be minimal.

During the integrated circuit manufacturing process, the patterns corresponding to the multiple project mask 100 and the secondary multiple project mask 200 are printed on the substrate in any order using the alignment and registration procedures defined by the exposure tool, in a known manner. Following the printing of the first pattern, the resist has been exposed but not developed. Thereafter, the mask 100, 200 corresponding to the second pattern is loaded into the exposure tool and printed onto the substrate in a known manner, using the same alignment marks used by the previous exposure, if appropriate. After the resist has been exposed by both the multiple project mask 100 and secondary multiple project mask 200, the resist is then developed in the conventional manner. The primary circuit pattern corresponding to the multiple project mask 100 and the pattern 250 satisfying the design rules are now defined on the substrate. The substrate is then processed to completion, in a known manner. It should be noted that the utility of the invention is independent of the resist tone (positive or negative resist).

As an illustrative example of such a process flow for a complementary metal oxide semiconductor (CMOS) process on a silicon wafer, it has been determined that the metal etch process of a 0.14 micrometer process (minimum critical dimension width or spacing) with 6 metal levels is sensitive to pattern density. Therefore, a set of pattern density design rules are established for the metal levels. The critical design rules are:

1. Metal 1—Area coverage Minimum is 25%.
2. Metal 1—Area coverage Maximum is 95%.
3. Metal 2 thru 6—Area coverage Minimum is 20%.
4. Metal 2 thru 6—Area coverage Maximum is 80%.

It is economically desirable to combine three circuits onto one photomask for use with this 0.14 micron process, with a pattern layout similar to FIG. 1. The borders 130, 140 between the circuits on the primary mask 100 must be 300 micrometers (substrate scale) to accommodate the lithography stepper framing blade placement requirements when each pattern area 110-1 through 110-3 is printed separately. To print the three pattern areas 110-1 through 110-3 simultaneously on a silicon wafer (possibly to verify the circuit designs), a secondary mask, such as the secondary multiple project mask 200 shown in FIG. 2, will be needed to render the borders 130, 140 between the circuit pattern areas 110-1 through 110-3 to a pattern density that will satisfy the metal coverage design rules, in accordance with the present invention.

It is not necessary to fabricate a secondary mask for each metal level, as a secondary multiple project mask 200 that has a pattern coverage between 25% and 80% will be acceptable for all of the metal levels. A secondary multiple project mask 200 is designed that contains opaque regions 210-1 through 210-3 in the three pattern areas 110-1 through 110-3. The secondary mask pattern 250 in the borders 230, 240 between the three pattern areas 110-1 through 110-3 is an array of boxes that are approximately 10 micrometers on each side and are separated to create a metal area coverage of approximately 50%. Because of the overlap in the design rules for the metal levels, only one secondary mask 200 is needed to complement each of the six metal levels.

The lithography process for printing the three pattern areas 110-1 through 110-3 simultaneously will proceed as follows:
1) The wafer will receive the normal lithography and processing up until the Metal 1 (M1) mask level.
2) The wafer(s) is coated with photoresist and the Metal 1 mask is used to print the pattern onto the resist coated substrate(s). The photoresist on the exposed substrate(s) is not developed.
3) The secondary mask 200 is used to expose the substrate(s).
4) The photoresist on the wafer(s) is developed.
5) The wafer is processed in the normal manner up until the Metal 2 level.
6) Steps 2 thru 4 are repeated, substituting the Metal 2 mask for Metal 1 mask and the wafer is processed in the normal manner up until the Metal 3 level.
7) The sequence of steps 2 through 6 is repeated until all 6 metal levels are printed and processed.
8) The rest of the wafer processing is completed in the normal manner.

In the sequence of processing steps, the term "normal" refers to the wafer process flow that is used when the secondary mask 200 is not used. Also, as previously indicated, in the sequence of processing, steps 2 and 3 can be interchanged without affecting the outcome.

In the previous example, the metal level process flow using the secondary mask 200 has been explained. It should be noted that other levels within this process technology may similarly require a complementary mask to satisfy design rules and would use a similar process as described in steps 1 thru 5.

It is to be understood that the embodiments and variations shown and described herein are merely illustrative of the principles of this invention and that various modifications may be implemented by those skilled in the art without departing from the scope and spirit of the invention.

We claim:

1. A method for manufacturing a substrate having a plurality of circuit patterns, said method comprising the steps of:
   exposing a substrate to a primary mask having a plurality of circuit patterns to be printed, wherein said plurality of circuit patterns are surrounded by one or more exclusion regions; and
   exposing said substrate to a secondary mask, wherein said secondary mask has a pattern that satisfies at least one design rule for a subsequent process, wherein said secondary mask pattern corresponds to said exclusion regions.

2. The method of claim 1, wherein said secondary mask pattern comprises an array of fill patterns.

3. The method of claim 2, wherein said array of fill patterns satisfies design rules for more than one process level such that said secondary mask can be utilized for multiple process levels.

4. The method of claim 1, wherein said at least one design rule specify one or more metal levels.

5. The method of claim 1, wherein said at least one design rule specifies characteristics for a chemical mechanical polishing process.

6. The method of claim 1, wherein said at least one design rule specifies characteristics for an etching process.

7. The method of claim 1, further comprising the step of developing a photoresist on said substrate.

8. The method of claim 1, wherein said step of exposing said substrate to a secondary mask is performed only on process levels wherein said exclusion regions violate a design rule.

9. The method of claim 1, wherein said substrate is a wafer.

10. The method of claim 1, wherein said substrate is a glass substrate used for a liquid crystal display.

11. A substrate having a plurality of circuit patterns, comprising:
    a plurality of circuit patterns printed from a primary mask, wherein said plurality of circuit patterns are surrounded by one or more exclusion regions; and
    a pattern printed from a secondary mask that satisfies at least one design rule for a subsequent process, wherein said secondary mask pattern corresponds to said exclusion regions.

12. The substrate of claim 11, wherein said secondary mask pattern comprises an array of fill patterns.

13. The substrate of claim 12, wherein said array of fill patterns satisfies design rules for more than one process level such that said secondary mask can be utilized for multiple process levels.

14. The substrate of claim 11, wherein said at least one design rule specify one or more metal levels.

15. The substrate of claim 11, wherein said substrate is a wafer.

16. The substrate of claim 11, wherein said substrate is a glass substrate used for a liquid crystal display.

17. A method for manufacturing a substrate having a plurality of circuit patterns, said method comprising the steps of:
    exposing a substrate to a primary mask having a plurality of circuit patterns surrounded by one or more exclusion regions; and
    exposing said substrate to a secondary mask having a pattern satisfying at least one design rule, wherein said secondary mask pattern corresponds to said exclusion regions.

18. The method of claim 17, wherein said secondary mask pattern comprises an array of fill patterns.

* * * * *